United States Patent
Huang et al.

(10) Patent No.: US 8,979,324 B2
(45) Date of Patent: Mar. 17, 2015

(54) OPTICAL DEVICE STRUCTURES WITH THE LIGHT OUTCOUPLING LAYERS

(75) Inventors: Yueh-Chuan Huang, Jhudong Township, Hsinchu County (TW); Chyi-Ming Leu, Jhudong Township, Hsinchu County (TW); Meng-Ting Hsieh, Zhudong Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 425 days.

(21) Appl. No.: 13/570,282

(22) Filed: Aug. 9, 2012

(65) Prior Publication Data

US 2013/0170224 A1 Jul. 4, 2013

(30) Foreign Application Priority Data

Dec. 29, 2011 (TW) .............................. 100149461 A

(51) Int. Cl.
*F21V 3/00* (2006.01)
*F21V 5/00* (2006.01)
*H01L 51/52* (2006.01)
*H01L 51/00* (2006.01)

(52) U.S. Cl.
CPC ......... *H01L 51/5262* (2013.01); *H01L 51/0077* (2013.01); *H01L 51/0081* (2013.01); *H01L 51/0085* (2013.01); *H01L 51/5275* (2013.01); *Y10T 428/269* (2013.01)
USPC ..... 362/311.02; 257/40; 257/98; 362/311.03; 428/339; 428/435; 528/353

(58) Field of Classification Search
USPC ............ 257/40, 98; 362/311.02, 311.03, 582, 362/629; 428/339, 435; 528/353
See application file for complete search history.

(56) References Cited

U.S. PATENT DOCUMENTS

| | | | |
|---|---|---|---|
| 7,187,117 | B2 | 3/2007 | Lu |
| 7,790,297 | B2 | 9/2010 | Nakagawa |
| 2003/0127973 | A1 | 7/2003 | Weaver et al. |
| 2005/0088078 | A1 | 4/2005 | Tseng et al. |
| 2006/0049749 | A1 | 3/2006 | Ishikawa et al. |
| 2006/0071233 | A1 | 4/2006 | Cho et al. |
| 2007/0241668 | A1 | 10/2007 | Ottermann et al. |

(Continued)

FOREIGN PATENT DOCUMENTS

| CN | 101882666 A | 11/2010 |
|---|---|---|
| TW | I270319 | 1/2007 |

(Continued)

OTHER PUBLICATIONS

TW Office Action dated Feb. 19, 2014. pp. 1-5.
Lee et al., "A high-extraction-efficiency nanopatterned organic light-emitting diode," Applied Physics Letters, May 26, 2003, vol. 82, No. 21, pp. 3779-3781.

(Continued)

*Primary Examiner* — Stephen F Husar
(74) *Attorney, Agent, or Firm* — Birch, Stewart, Kolasch & Birch, LLP

(57) ABSTRACT

An optical device structure with a light outcoupling layer is provided. The optical device structure includes a substrate having a first surface and a second surface, and a layer of polyimide (PI) or its copolymer formed on the first surface of the substrate, wherein the layer of polyimide or its copolymer is prepared from at least one aromatic diamine and at least one cycloaliphatic dianhydride, and an optical component formed on the layer of polyimide or its copolymer.

10 Claims, 3 Drawing Sheets

(56) References Cited

U.S. PATENT DOCUMENTS

| | | |
|---|---|---|
| 2008/0129191 A1 | 6/2008 | Lee et al. |
| 2008/0284320 A1 | 11/2008 | Karkkainen |
| 2009/0137770 A1* | 5/2009 | Leu et al. ............... 528/353 |
| 2010/0181899 A1 | 7/2010 | Forrest et al. |
| 2010/0194717 A1 | 8/2010 | Mori et al. |
| 2011/0121271 A1 | 5/2011 | Jeon et al. |

FOREIGN PATENT DOCUMENTS

| | | |
|---|---|---|
| TW | I273128 | 2/2007 |
| TW | I286270 | 9/2007 |
| TW | 201137039 A1 | 11/2011 |

OTHER PUBLICATIONS

Moller et al., "Improved light out-coupling in organic light emitting diodes employing ordered microlens arrays," Journal of Applied Physics, Mar. 1, 2002, vol. 91, No. 5, pp. 3324-3327.

Reineke et al., "White organic light-emitting diodes with fluorescent tube efficiency," Nature, May 14, 2009, vol. 459, pp. 234-238.

Sun et al., "Enhanced light out-coupling of organic light-emitting devices using embedded low-index grids," Nature Photonics, Aug. 2008, vol. 2, pp. 483-487.

You et al., "Synthesis of High Refractive Index Polyimides Derived from 1,6-Bis(p-aminophenylsulfanyl)-3,4,8,9-tetrahydro-2,5,7,10-tetrathiaanthracene and Aromatic Dianhydrides," Macromolecules, 2008, vol. 41, No. 17, pp. 6361-6366.

* cited by examiner

OPTICAL DEVICE STRUCTURES WITH THE LIGHT OUTCOUPLING LAYERS

CROSS REFERENCE TO RELATED APPLICATIONS

This application claims priority of Taiwan Patent Application No. 100149461, filed on Dec. 29, 2011, the entirety of which is incorporated by reference herein.

BACKGROUND

1. Technical Field

The technical field relates to an optical device structure comprising a layer of polyimide (PI) or its copolymer.

2. Description of the Related Art

Organic light emitting diodes (OLEDs) have been deemed as a rising star of flat panel displays or the lighting industry due to superior characteristics thereof including light weight, thin profile, self-luminescence, low power consumption, no requirement of a backlight source, no limitation of viewing angle and rapid response time etc. In order to be more competitive in the display and lighting markets, R & D units in the world invest a great deal of funds and human resources to improve device efficiency. In addition to the development of interior luminescent materials, exterior light outcoupling is also capable of improving device efficiency. However, the distinction of the refraction index between various layers in an OLED is large (mismatch of refraction index) which causes only 20% of light to be emitted from the front of the device. If light reflection and refraction at the interfaces between each layer is lowered and the light inside the device is outcoupled again by improving the refraction index of each layer, the luminous efficiency of the OLED can thus be improved. The addition of high/low-refraction-index layers or microparticles which contribute to light refraction to the device structure is popular. However, most of the high/low-refraction-index materials mainly comprise inorganic materials. The organic materials with high heat resistance are rarely used. Additionally, while subsequently fabricating an ITO conductive film on such organic materials, the problem of surface damage of the organic material when the ITO is deposited needs to be overcome. Also, since the requirement of low resistance and high penetration rate of the ITO also needs to be considered, the options of materials are quite constrained. Therefore, development of one kind of material with transparency, high heat resistance, a flat surface, simple fabrication and low cost is quite competitive and a top priority.

SUMMARY

One embodiment of the disclosure provides an optical device structure with a light outcoupling layer, comprising: a substrate having a first surface and a second surface; a layer of polyimide (PI) or its copolymer formed on the first surface of the substrate, wherein the layer of polyimide or its copolymer is prepared from at least one aromatic diamine and at least one cycloaliphatic dianhydride; and an optical component formed on the layer of polyimide or its copolymer.

The disclosure provides an optical device structure which can efficiently improve light outcoupling efficiency, having a polyimide (PI) material (light outcoupling layer) with transparency, high heat resistance and a refraction index of 1.6-1.8. After the upper conductive film (for example ITO) is sintered (annealed) at a high temperature, the surface resistance value and a refraction index of the upper conductive film are decreased and the penetration rate thereof is improved due to the above-mentioned polyimide (PI) material, substantially improving the luminous efficiency of the OLED to around 1.25 times that of the conventional one. Also, the combination of an outer microlens with the OLED is capable of improving the device efficiency to around 1.8-2 times that of the conventional one. In addition, particles which contribute to light refraction can also be added between the glass substrate and the polyimide (PI) material capable of planarizing the surface of the thin film formed by the particles. In addition to improvement of light outcoupling efficiency, the polyimide (PI) material can also decrease the surface protrusions of the subsequently fabricated ITO which lowers electric leakage and black spots and improves the lifespan of an OLED.

In the disclosure, the polyimide (PI) material is first coated on the glass substrate or the glass substrate coated with microparticles. The ITO film is subsequently sputtered on the polyimide (PI) material and sintered (annealed) at a high temperature. The OLED components are then fabricated. If the materials which cannot endure high temperature are used as the light outcoupling layer, the fabricated ITO film is incapable of sintering (annealing) at a high temperature. In such a situation, the distinction of the refraction index between the ITO film and the glass substrate is large which causes only 20% of light to be emitted from the front of the device. The light outcoupling layer of the disclosure adopts the polyimide (PI) material with high heat resistance such that subsequent processes are capable of enduring high temperatures and the refraction index of the high temperature-sintered (annealed) ITO is improved to match the refraction index of the OLED components, lowering light reflection and refraction at the interfaces between the substrate/ITO and between the ITO/organic light emitting layer, and improving the light outcoupling performance of an OLED. The light inside the device can thus be outcoupled again. Additionally, the microlens can be used to solve the light issue that occurs between the substrate and air, efficiently improving the luminous efficiency of an OLED.

A detailed description is given in the following embodiments with reference to the accompanying drawings.

DETAILED DESCRIPTION

Figure 1:
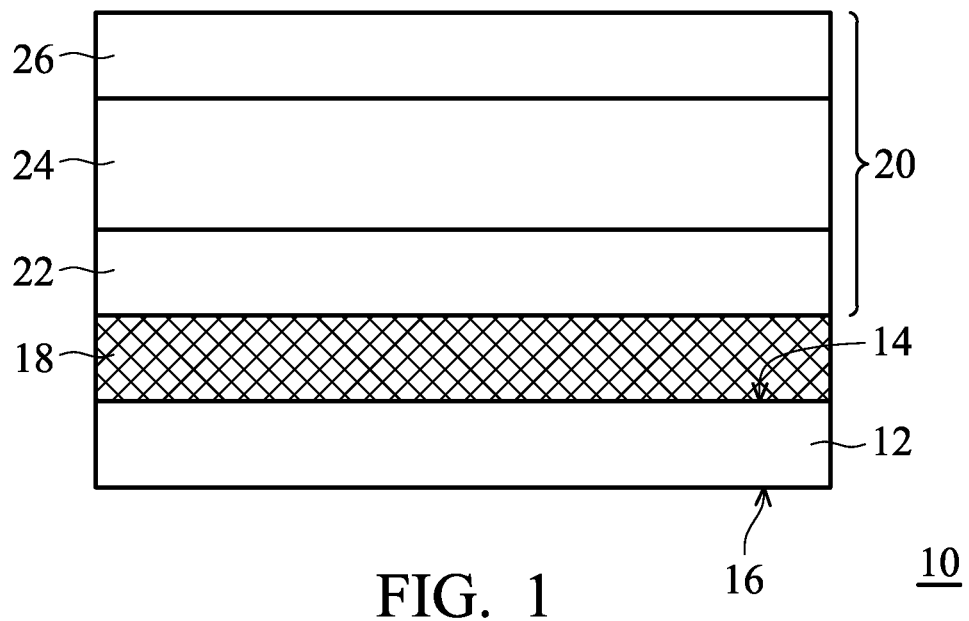
FIG. 1 shows a cross-sectional view of an optical device structure with a light outcoupling layer according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, in accordance with one embodiment of the disclosure, an optical device structure with a light outcoupling layer is provided. The optical device structure 10 comprises a substrate 12, a layer of polyimide (PI) or its copolymer 18 and an optical component 20. The substrate 12 has a first surface 14 and a second surface 16. The layer of polyimide (PI) or its copolymer 18 is formed on the first surface 14 of the substrate 12. The optical component 20 is formed on the layer of polyimide (PI) or its copolymer 18. Specifically, the layer of polyimide or its copolymer 18 is prepared from at least one aromatic diamine and at least one cycloaliphatic dianhydride.

The substrate 12 may comprise a glass substrate.

The aromatic diamine used to prepare the layer of polyimide or its copolymer 18 may comprise

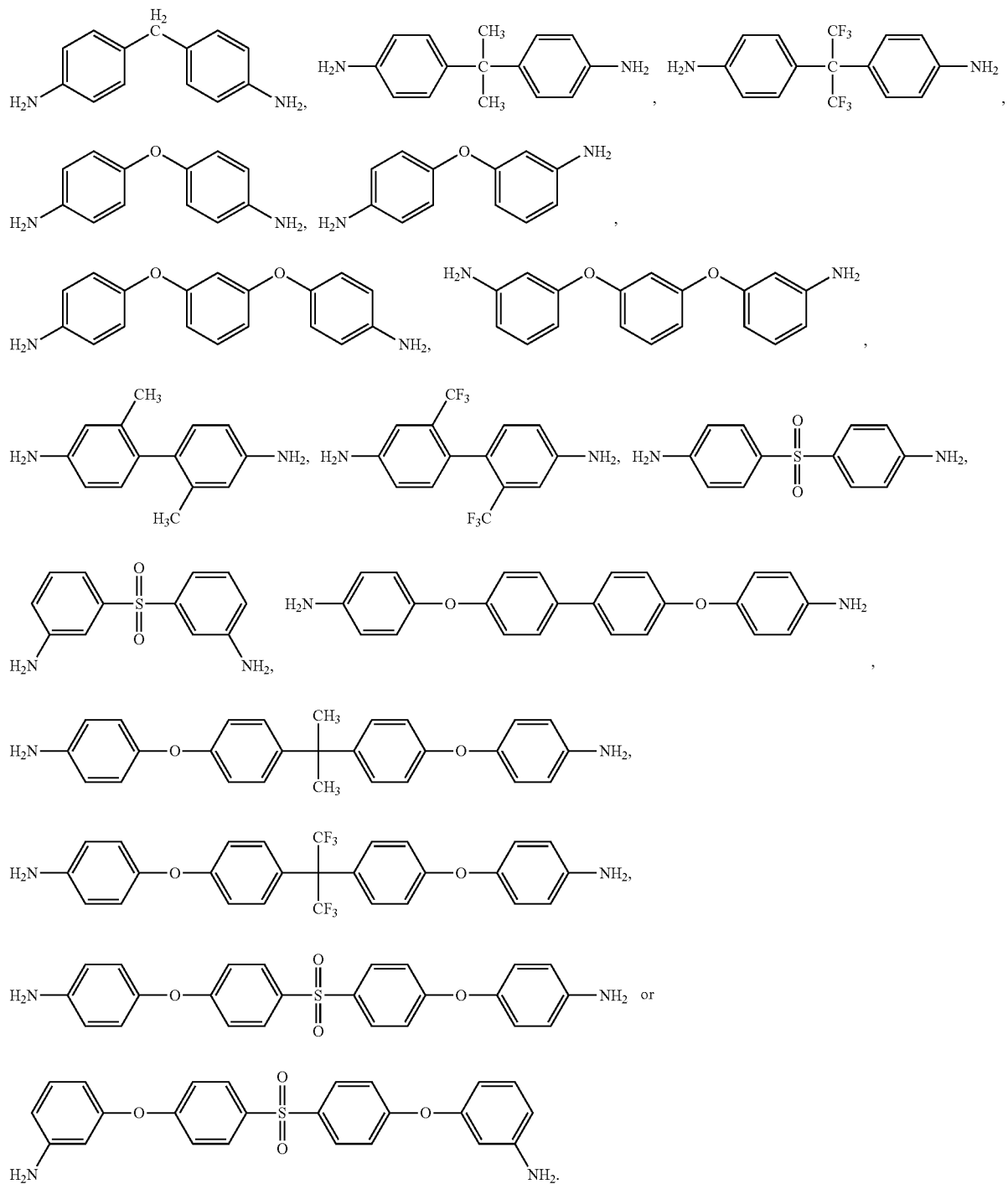

The cycloaliphatic dianhydride used to prepare the layer of polyimide or its copolymer 18 may comprise

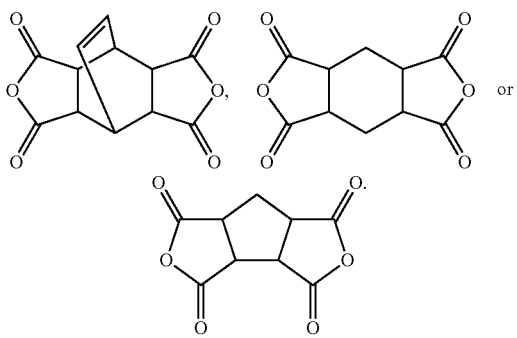

The layer of polyimide (PI) or its copolymer 18 has a thickness of about 100-1,000 nm.

The optical component 20 may comprise a first electrode 22, an organic light emitting layer 24 and a second electrode 26 to form an organic light emitting diode (OLED). The first electrode 22 may comprise indium tin oxide (ITO).

Figure 2:
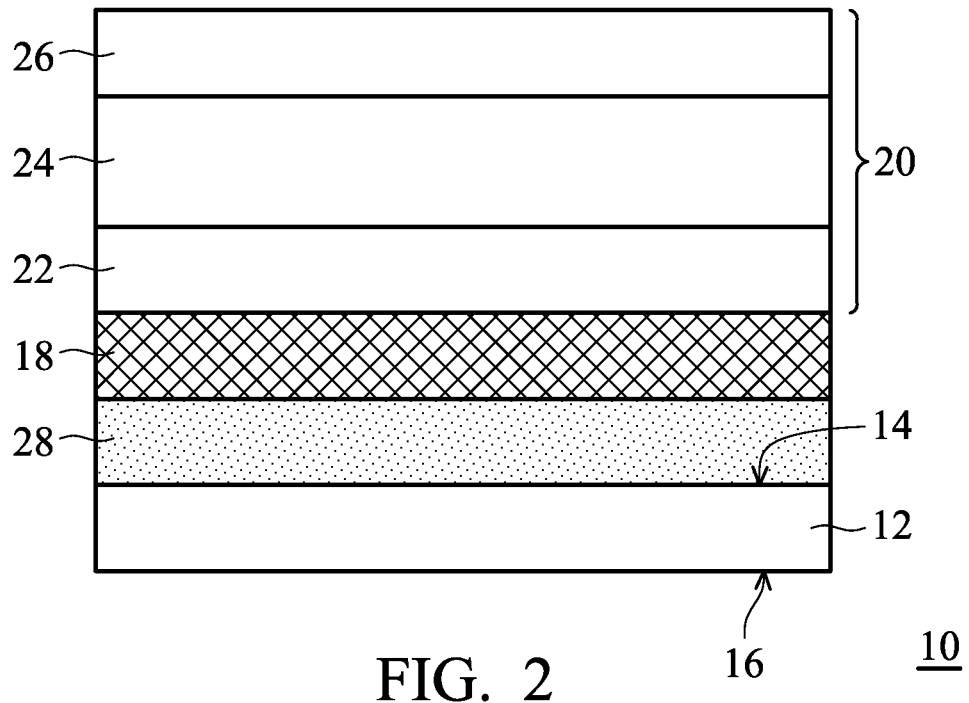
FIG. 2 shows a cross-sectional view of an optical device structure with a light outcoupling layer according to an embodiment.

A plurality of microparticles 28 may further be coated on the first surface 14 of the substrate 12, as shown in FIG. 2. The microparticles 28 may comprise metal oxides or inorganic oxides, for example silicon oxide.

Figure 3:
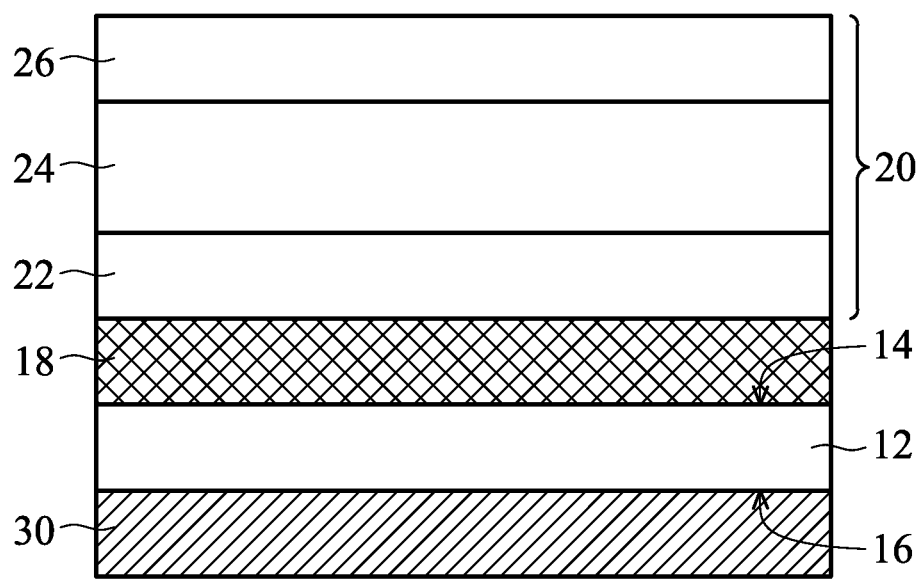
FIG. 3 shows a cross-sectional view of an optical device structure with a light outcoupling layer according to an embodiment.

In another embodiment, the optical device structure 10 may further comprise a microlens 30 formed on the second surface 16 of the substrate 12, as shown in FIG. 3. The microlens 30 may be convex, for example a hemispheric shape.

The disclosure provides an optical device structure which can efficiently improve light outcoupling efficiency, having a polyimide (PI) material (light outcoupling layer) with transparency, high heat resistance and a refraction index of 1.6-1.8. After the upper conductive film (for example ITO) is sintered (annealed) at a high temperature, the surface resistance value and a refraction index of the upper conductive film are decreased and the penetration rate thereof is improved due to the above-mentioned polyimide (PI) material, substantially improving the luminous efficiency of the OLED to around 1.25 times that of the conventional one. Also, the combination of an outer microlens with the OLED is capable of improving the device efficiency to around 1.8-2 times that of the conventional one. In addition, particles which contribute to light refraction can also be added between the glass substrate and the polyimide (PI) material capable of planarizing the surface of the thin film formed by the particles. In addition to improvement of light outcoupling efficiency, the polyimide (PI) material can also decrease the surface protrusions of the subsequently fabricated ITO which lowers electric leakage and black spots and improves the lifespan of an OLED.

In the disclosure, the polyimide (PI) material is first coated on the glass substrate or the glass substrate coated with microparticles. The ITO film is subsequently sputtered on the polyimide (PI) material and sintered (annealed) at a high temperature. The OLED components are then fabricated. If the materials which cannot endure high temperature are used as the light outcoupling layer, the fabricated ITO film is incapable of sintering (annealing) at a high temperature. In such a situation, the distinction of the refraction index between the ITO film and the glass substrate is large which causes only 20% of light to be emitted from the front of the device. The light outcoupling layer of the disclosure adopts the polyimide (PI) material with high heat resistance such that subsequent processes are capable of enduring high temperatures and the refraction index of the high temperature-sintered (annealed) ITO is improved to match the refraction index of the OLED components, lowering light reflection and refraction at the interfaces between the substrate/ITO and between the ITO/organic light emitting layer, and improving the light outcoupling performance of an OLED. The light inside the device can thus be outcoupled again. Additionally, the microlens can be used to solve the light issue that occurs between the substrate and air, efficiently improving the luminous efficiency of an OLED.

EXAMPLE 1

Preparation and Physical Properties of the Polyimide (PI-1)

A polyimide comprising 2,2-bis[4-(4-aminophenoxy)phenyl]propane A and bicyclo[2,2,2]oct-7-ene-2,3,5,6-tetracarboxylic dianhydride B with a composition ratio of 5:5 was prepared. First, 82.7 g of 2,2-bis[4-(4-aminophenoxy)phenyl]propane A, 50 g of bicyclo[2,2,2]oct-7-ene-2,3,5,6-tetracarboxylic dianhydride B and 530.8 g of m-cresol were added to a 2 L glass reactor and reacted with electric stirring under 220° C. for 4 hours to form a polyimide solution with a solid content of 20%. The polyimide solution was then re-precipitated with methanol. After drying, filamentous polyimide (PI) was obtained. The filamentous polyimide (PI) was dissolved by dimethyl acetamide to prepare a polyimide (PI-1) solution with a solid content of 15%.

In this example, the b value (yellow value) of the prepared polyimide (PI-1) was 2.37.

EXAMPLE 2

Preparation and Physical Properties of the Polyimide (PI-2)

A polyimide comprising 2,2-bis[4-(4-aminophenoxy)phenyl]propane A, 4,4-diaminodiphenyl ether B and pyromellitic dianhydride C with a composition ratio of 3:7:10 was prepared. First, 28.2 g of 2,2-bis[4-(4-aminophenoxy)phenyl]propane A, 32.1 g of 4,4-diaminodiphenyl ether B, 50 g of pyromellitic dianhydride C and 441.4 g of m-cresol were added to a 2 L glass reactor and reacted with electric stirring under 220° C. for 4 hours to form a polyimide solution with a solid content of 20%. The polyimide solution was then re-precipitated with methanol. After drying, filamentous polyimide (PI) was obtained. The filamentous polyimide (PI) was dissolved by dimethyl acetamide to prepare a polyimide (PI-2) solution with a solid content of 15%.

In this example, the b value (yellow value) of the prepared polyimide (PI-2) was 1.95.

EXAMPLE 3

Preparation and Physical Properties of the Polyimide (PI-3)

A polyimide comprising 2,2-bis[4-(4-aminophenoxy)phenyl]propane A and bicyclo[2,2,2]oct-7-ene-2,3,5,6-tetracarboxylic dianhydride B with a composition ratio of 5:5 was prepared. First, 82.7 g of 2,2-bis[4-(4-aminophenoxy)phenyl]propane A, 50 g of bicyclo[2,2,2]oct-7-ene-2,3,5,6-tetracarboxylic dianhydride B and 530.8 g of m-cresol were added to a 2 L glass reactor and reacted with electric stirring under 220° C. for 4 hours to form a polyimide solution with a solid content of 20%. The polyimide solution was then re-precipitated with methanol. After drying, filamentous polyimide (PI) was obtained. The filamentous polyimide (PI) was dissolved by dimethyl acetamide to prepare a polyimide (PI-3) solution with a solid content of 15%.

In this example, the b value (yellow value) of the prepared polyimide (PI-3) was 2.37.

EXAMPLE 4

Preparation and Physical Properties of the Polyimide (PI-4)

A polyimide comprising 4,4'-bis(3-aminophenoxy)diphenyl sulfone A, 4,4-bis(4-aminophenoxy)biphenyl B and 1,2,3,4-cyclopentanetetracarboxylic dianhydride C with a composition ratio of 5:5:10 was prepared. First, 51.5 g of 4,4'-bis(3-aminophenoxy)diphenyl sulfone A, 43.8 g of 4,4-bis(4-aminophenoxy)biphenyl B, 50 g of 1,2,3,4-cyclopentanetetracarboxylic dianhydride C and 581.1 g of m-cresol were added to a 2 L glass reactor and reacted with electric stirring under 220° C. for 4 hours to form a polyimide solution with a solid content of 20%. The polyimide solution was then re-precipitated with methanol. After drying, filamentous polyimide (PI) was obtained. The filamentous polyimide (PI) was dissolved by dimethyl acetamide to prepare a polyimide (PI-4) solution with a solid content of 15%.

In this example, the b value (yellow value) of the prepared polyimide (PI-4) was 2.12.

COMPARATIVE EXAMPLE 1

Preparation and Luminous Efficiency of a Conventional OLED Structure (Glass Substrate/ITO, without Convex Microlens)

First, a glass substrate was washed by RO water and dried. An ITO film was then prepared on the glass substrate and sintered under 250° C. for 60 minutes. The surface of the ITO film was then cleaned by a UV ozone cleaner. Next, the glass substrate/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this Comparative Example, the luminous efficiency of the OLED structure was 16.96 Cd/A.

COMPARATIVE EXAMPLE 2

Preparation and Luminous Efficiency of a Conventional OLED Structure (Glass Substrate/ITO, with a Convex Microlens)

First, a glass substrate was washed by RO water and dried. An ITO film was then prepared on the glass substrate and sintered under 250° C. for 60 minutes. The surface of the ITO film was then cleaned by a UV ozone cleaner. Next, the glass substrate/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A convex microlens was pasted on the light extraction side of the device. The IVB property of the device was measured.

In this Comparative Example, the luminous efficiency of the OLED structure was 22.95 Cd/A.

EXAMPLE 5

Preparation and Luminous Efficiency of the OLED Structure with the Light Outcoupling Layer (Glass Substrate/PI-1/ITO, without Convex Microlens)

First, a glass substrate was washed by RO water and dried. Next, a PI-1 material was coated on the glass substrate with a thickness of 500 nm. An ITO film was then prepared on the glass substrate and sintered under 250° C. for 60 minutes. The surface of the ITO film was then cleaned by a UV ozone cleaner. Next, the glass substrate/PI-1/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this example, the luminous efficiency of the OLED structure was 21.90 Cd/A, improving 29.13% from that of Comparative Example 1.

EXAMPLE 6

Preparation and Luminous Efficiency of the OLED Structure with the Light Outcoupling Layer (Glass Substrate/PI-1/ITO, with a Convex Microlens)

First, a glass substrate was washed by RO water and dried. Next, a PI-1 material was coated on the glass substrate. An ITO film was then prepared on the glass substrate and sintered under 250° C. for 60 minutes. The surface of the ITO film was then cleaned by a UV ozone cleaner. Next, the glass substrate/PI-1/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A convex microlens was pasted on the light extraction side of the device. Next, the IVB property of the device was measured.

In this Comparative Example, the luminous efficiency of the OLED structure was 34.85 Cd/A, improving 105.48% from that of Comparative Example 1.

EXAMPLE 7

Preparation and Luminous Efficiency of the OLED Structure with the Light Outcoupling Layer (Glass Substrate/PI-2/ITO, without Convex Microlens)

First, a glass substrate was washed by RO water and dried. Next, a PI-2 material was coated on the glass substrate. An ITO film was then prepared on the glass substrate and sintered under 250° C. for 60 minutes. The surface of the ITO film was then cleaned by a UV ozone cleaner. Next, the glass substrate/PI-2/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this example, the luminous efficiency of the OLED structure was 21.49 Cd/A, improving 26.71% from that of Comparative Example 1.

EXAMPLE 8

Preparation and Luminous Efficiency of the OLED Structure with the Light Outcoupling Layer (Glass Substrate/PI-2/ITO, with a Convex Microlens)

First, a glass substrate was washed by RO water and dried. Next, a PI-2 material was coated on the glass substrate. An ITO film was then prepared on the glass substrate and sintered under 250° C. for 60 minutes. The surface of the ITO film was then cleaned by a UV ozone cleaner. Next, the glass substrate/PI-2/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A convex microlens was pasted on the light extraction side of the device. Next, the IVB property of the device was measured.

In this Comparative Example, the luminous efficiency of the OLED structure was 34.67 Cd/A, improving 104.42% from that of Comparative Example 1.

EXAMPLE 9

Preparation and Luminous Efficiency of the OLED Structure with the Light Outcoupling Layer (Glass Substrate/Microparticles/PI-3/ITO, without Convex Microlens)

First, a glass substrate was washed by RO water and dried. Next, a mesoporous silicon dioxide and a PI-3 material were sequentially coated on the glass substrate with a thickness of 500 nm. An ITO film was then prepared on the glass substrate and sintered under 250° C. for 60 minutes. The surface of the ITO film was then cleaned by a UV ozone cleaner. Next, the glass substrate/mesoporous silicon dioxide/PI-3/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this example, the luminous efficiency of the OLED structure was 23.23 Cd/A, improving 36.97% from that of Comparative Example 1.

EXAMPLE 10

Preparation and Luminous Efficiency of the OLED Structure with the Light Outcoupling Layer (Glass Substrate/Microparticles/PI-3/ITO, with a Convex Microlens)

First, a glass substrate was washed by RO water and dried. Next, a mesoporous silicon dioxide and a PI-3 material were sequentially coated on the glass substrate. An ITO film was then prepared on the glass substrate and sintered under 250° C. for 60 minutes. The surface of the ITO film was then cleaned by a UV ozone cleaner. Next, the glass substrate/mesoporous silicon dioxide/PI-3/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A convex microlens was pasted on the light extraction side of the device. Next, the IVB property of the device was measured.

In this Comparative Example, the luminous efficiency of the OLED structure was 34.23 Cd/A, improving 101.83% from that of Comparative Example 1.

EXAMPLE 11

Preparation and Luminous Efficiency of the OLED Structure with the Light Outcoupling Layer (Glass Substrate/Microparticles/PI-4/ITO, without Convex Microlens)

First, a glass substrate was washed by RO water and dried. Next, a mesoporous silicon dioxide and a PI-4 material were sequentially coated on the glass substrate. An ITO film was then prepared on the glass substrate and sintered under 250° C. for 60 minutes. The surface of the ITO film was then cleaned by a UV ozone cleaner. Next, the glass substrate/mesoporous silicon dioxide/PI-4/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this example, the luminous efficiency of the OLED structure was 24.10 Cd/A, improving 42.10% from that of Comparative Example 1.

EXAMPLE 12

Preparation and Luminous Efficiency of the OLED Structure with the Light Outcoupling Layer (Glass Substrate/Microparticles/PI-4/ITO, with a Convex Microlens)

First, a glass substrate was washed by RO water and dried. Next, a mesoporous silicon dioxide and a PI-4 material were sequentially coated on the glass substrate. An ITO film was then prepared on the glass substrate and sintered under 250° C. for 60 minutes. The surface of the ITO film was then cleaned by a UV ozone cleaner. Next, the glass substrate/mesoporous silicon dioxide/PI-4/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A convex microlens was pasted on the light extraction side of the device. Next, the IVB property of the device was measured.

In this Comparative Example, the luminous efficiency of the OLED structure was 33.58 Cd/A, improving 98.00% from that of Comparative Example 1.

COMPARATIVE Example 3

Preparation and Luminous Efficiency of a Conventional OLED Structure (Glass Substrate/ITO, without Non-Convex Microlens)

First, a glass substrate was washed by RO water and dried. An ITO film was then prepared on the glass substrate and sintered under 250° C. for 60 minutes. The surface of the ITO film was then cleaned by a UV ozone cleaner. Next, the glass substrate/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this Comparative Example, the luminous efficiency of the OLED structure was 20.23 Cd/A.

COMPARATIVE Example 4

Preparation and Luminous Efficiency of a Conventional OLED Structure (Glass Substrate/ITO, with a Non-Convex Microlens)

First, a glass substrate was washed by RO water and dried. An ITO film was then prepared on the glass substrate and sintered under 250° C. for 60 minutes. The surface of the ITO film was then cleaned by a UV ozone cleaner. Next, the glass substrate/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A non-convex microlens was pasted on the light extraction side of the device. The IVB property of the device was measured.

In this Comparative Example, the luminous efficiency of the OLED structure was 27.61 Cd/A.

EXAMPLE 13

Preparation and Luminous Efficiency of the OLED Structure with the Light Outcoupling Layer (Glass Substrate/PI-1/ITO, with a Non-Convex Microlens)

First, a glass substrate was washed by RO water and dried. Next, a PI-1 material was coated on the glass substrate. An ITO film was then prepared on the glass substrate and sintered under 250° C. for 60 minutes. The surface of the ITO film was then cleaned by a UV ozone cleaner. Next, the glass substrate/PI-1/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A non-convex microlens was pasted on the light extraction side of the device. Next, the IVB property of the device was measured.

In this Comparative Example, the luminous efficiency of the OLED structure was 28.78 Cd/A, improving 42.26% from that of Comparative Example 3.

COMPARATIVE EXAMPLE 5

Preparation and Luminous Efficiency of a Conventional OLED Structure (Glass Substrate/ITO, without Convex Microlens)

First, a glass substrate was washed by RO water and dried. An ITO film was then prepared on the glass substrate and sintered under 250° C. for 60 minutes. The surface of the ITO film was then cleaned by a UV ozone cleaner. Next, the glass substrate/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this Comparative Example, the luminous efficiency of the OLED structure was 22.45 Cd/A.

COMPARATIVE EXAMPLE 6

Preparation and Luminous Efficiency of a Conventional OLED Structure (Glass Substrate/YPI/ITO, without Convex Microlens)

First, a glass substrate was washed by RO water and dried. Next, an YPI material was coated on the glass substrate. An ITO film was then prepared on the glass substrate and sintered under 250° C. for 60 minutes. The surface of the ITO film was then cleaned by a UV ozone cleaner. Next, the glass substrate/YPI/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. The IVB property of the device was measured.

In this Comparative Example, the luminous efficiency of the OLED structure was 22.70 Cd/A.

COMPARATIVE EXAMPLE 7

Preparation and Luminous Efficiency of a Conventional OLED Structure (Glass Substrate/YPI/ITO, with a Convex Microlens)

First, a glass substrate was washed by RO water and dried. Next, an YPI (yellow PI) material was coated on the glass substrate. The YPI was prepared by pyromellitic acid dianhydride (PMDA). An ITO film was then prepared on the glass substrate and sintered under 250° C. for 60 minutes. The surface of the ITO film was then cleaned by a UV ozone cleaner. Next, the glass substrate/YPI/ITO was evaporated with NPB (50 nm)/CBP:Ir(ppy)$_3$ (10 nm, 5%)/BCP (10 nm)/AlQ (35 nm)/LiF (0.5 nm)/Al (120 nm) thereon in an evaporator. The device was then packaged. A convex microlens was pasted on the light extraction side of the device. Next, the IVB property of the device was measured.

In this Comparative Example, the luminous efficiency of the OLED structure was 26.45 Cd/A.

EXAMPLE 14

Alteration of Surface Resistance Values of ITO Under High-Temperature Annealing in the OLED Structure with the Light Outcoupling Layer The alteration of surface resistance values of ITO under high-temperature annealing, respectively, in a conventional OLED structure and the OLED structure with the light outcoupling layer is shown in Table 1.

TABLE 1

|  | Glass substrate/ ITO | Glass substrate/ PI-1/ITO | Glass substrate/ ITO (annealing) | Glass substrate/ PI-1/ITO (annealing) |
| --- | --- | --- | --- | --- |
| Surface resistance value (Ohm/sq.) | 25-29 | 25-29 | 24-28 | 18-20 |

EXAMPLE 15

Alteration of Refraction Index of ITO Under High-Temperature Annealing in the OLED Structure with the Light Outcoupling Layer The alteration of refraction index of ITO under high-temperature annealing in the OLED structure with the light outcoupling layer is shown in Table 2.

TABLE 2

|  | Glass substrate/ PI-1/ITO | Glass substrate/ PI-1/ITO (annealing) |
| --- | --- | --- |
| Refraction index (n) | 2.026 | 1.896 |

EXAMPLE 16

Figure 4:
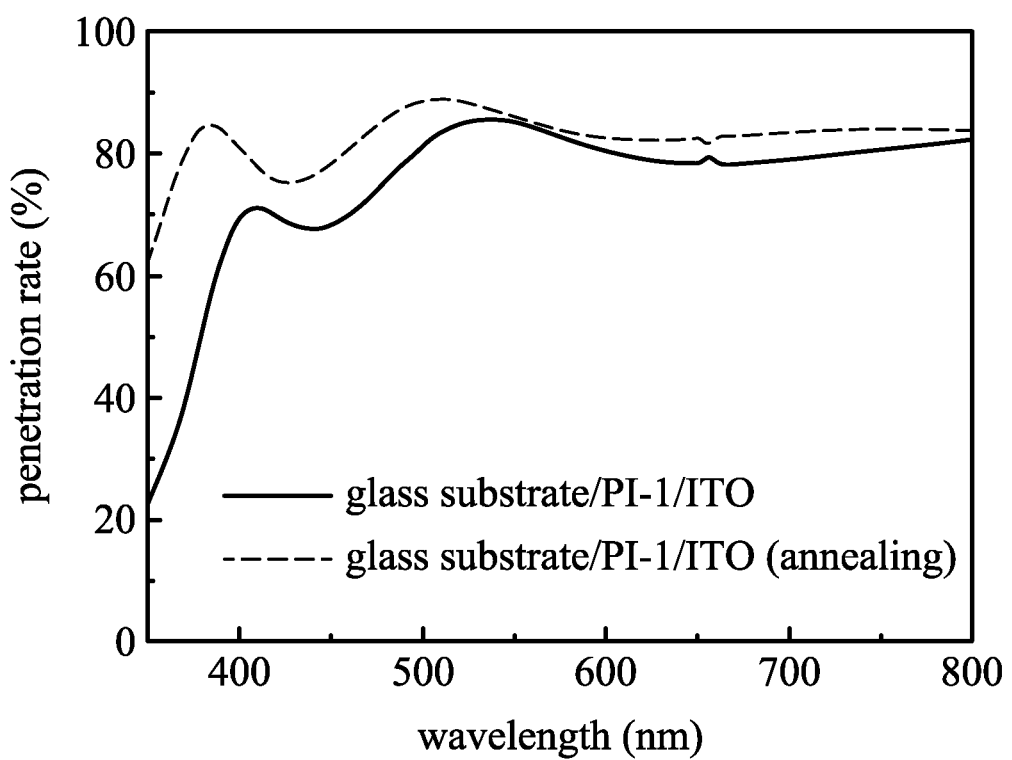
FIG. 4 shows an alteration of the penetration rate of ITO under a high-temperature annealing in an optical device structure with a light outcoupling layer according to an embodiment.

Alteration of the Penetration Rate of ITO Under High-Temperature Annealing in the OLED Structure with the Light Outcoupling Layer The alteration of the penetration rate of ITO under high-temperature annealing in the OLED structure with the light outcoupling layer is shown in FIG. 4.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An optical device structure with a light outcoupling layer, comprising:
   a substrate having a first surface and a second surface;
   a layer of polyimide (PI) or its copolymer formed on the first surface of the substrate, wherein the layer of polyimide or its copolymer is prepared from at least one aromatic diamine and at least one cycloaliphatic dianhydride; and
   an optical component formed on the layer of polyimide or its copolymer.

2. The optical device structure with a light outcoupling layer as claimed in claim 1, wherein the substrate comprises a glass substrate.

3. The optical device structure with a light outcoupling layer as claimed in claim 1, further comprising a plurality of microparticles coated on the first surface of the substrate.

4. The optical device structure with a light outcoupling layer as claimed in claim 3, wherein the microparticles comprise metal oxides or inorganic oxides.

5. The optical device structure with a light outcoupling layer as claimed in claim 1, wherein the aromatic diamine comprises

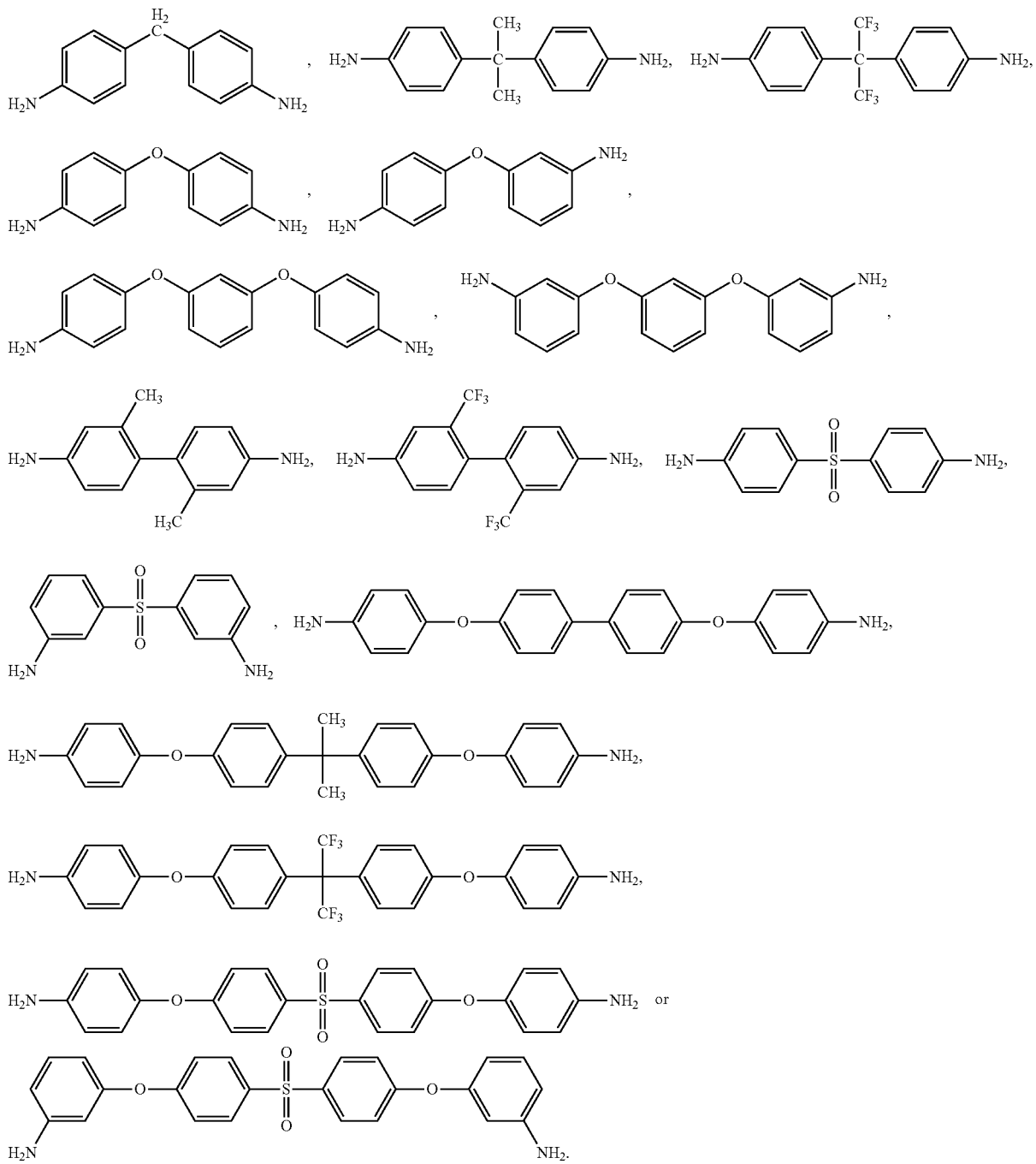

6. The optical device structure with a light outcoupling layer as claimed in claim 1, wherein the cycloaliphatic dianhydride comprises

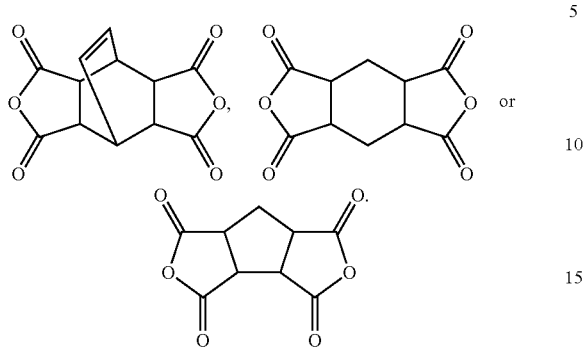

7. The optical device structure with a light outcoupling layer as claimed in claim 1, wherein the layer of polyimide (PI) or its copolymer has a thickness of 100-1,000 nm.

8. The optical device structure with a light outcoupling layer as claimed in claim 1, wherein the optical component comprises an organic light emitting diode (OLED).

9. The optical device structure with a light outcoupling layer as claimed in claim 1, further comprising a microlens formed on the second surface of the substrate.

10. The optical device structure with a light outcoupling layer as claimed in claim 9, wherein the microlens is convex.

* * * * *